US011901866B2

(12) United States Patent
Huang

(10) Patent No.: US 11,901,866 B2
(45) Date of Patent: Feb. 13, 2024

(54) CHARGE-STEERING AMPLIFIER-BASED AMPLIFIER CIRCUIT

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/717,178

(22) Filed: Apr. 11, 2022

(65) Prior Publication Data

US 2023/0040066 A1 Feb. 9, 2023

(30) Foreign Application Priority Data

Aug. 4, 2021 (TW) .................................. 110128640

(51) Int. Cl.
 H03F 3/16 (2006.01)
 H03F 3/26 (2006.01)
(52) U.S. Cl.
 CPC ..................................... H03F 3/16 (2013.01)
(58) Field of Classification Search
 CPC ............. H03F 3/16; H03F 2203/45634; H03F 3/45237; H03F 3/45183; H03F 2203/45461
 USPC .......................................... 330/302, 252–261
 See application file for complete search history.

(56) References Cited

U.S. PATENT DOCUMENTS

| 10,084,412 B2 | 9/2018 | Lei et al. | |
| 10,554,453 B1 * | 2/2020 | Parvizi | H04L 25/03063 |
| 10,594,264 B2 * | 3/2020 | Hsieh | H03G 1/0094 |
| 2016/0276991 A1 | 9/2016 | Lin | |
| 2020/0358409 A1 * | 11/2020 | Lee | H03F 3/45237 |

FOREIGN PATENT DOCUMENTS

CN 110661499 A 1/2020

OTHER PUBLICATIONS

Behzad Razavi., "Charge Steering: A Low-Power Design Paradigm", 2013, pp. 1-8, IEEE.
DA letter of a counterpart TW application (appl. no. 110128640) dated Dec. 27, 2021. Summary of the OA letter: Claim(s) 1-2 is/are rejected under Patent Law Article 22(2) as being unpatentable over reference 1 (CN 110661499 A) and reference 2 (US 2016/0276991 A1). Claim correspondence between the TW counterpart application and the Instant US application: Claims 1-10 in the TW counterpart application correspond to claims 1-3, 6, 9, 11, 12, 13, 16 and 19 in the instant US application, respectively.

* cited by examiner

*Primary Examiner* — Hieu P Nguyen
(74) *Attorney, Agent, or Firm* — WPAT, P.C.

(57) ABSTRACT

An amplifier circuit, which has a first output terminal and a second output terminal, includes a first charge-steering amplifier, a second charge-steering amplifier, a first switch, and a second switch. The first charge-steering amplifier includes a first input terminal, a second input terminal, a first capacitor, and a second capacitor, and is used for amplifying a first input signal in a first operation period. The second charge-steering amplifier includes a third input terminal, a fourth input terminal, the first capacitor, and the second capacitor, and is used for amplifying a second input signal in a second operation period. The first capacitor and the second capacitor charge during the first operation period and discharge during the second operation period.

20 Claims, 5 Drawing Sheets

CHARGE-STEERING AMPLIFIER-BASED AMPLIFIER CIRCUIT

BACKGROUND OF THE INVENTION

1. Field of the Invention

The present invention generally relates to charge-steering amplifiers, and, more particularly, to amplifier circuits embodied by charge-steering amplifiers.

2. Description of Related Art

FIG. 1 is a circuit diagram of a conventional charge-steering amplifier. The charge-steering amplifier (a.k.a. a dynamic amplifier) 100 mainly comprises a transistor 110 and a transistor 120 and further includes a switch 130, a switch 140, a switch 150, a switch 160, a capacitor 170, a capacitor 180, and a capacitor 190. These components are connected in a way that is shown in FIG. 1. The charge-steering amplifier 100 operates alternately in a reset phase (in which the switch 130, the switch 140, and the switch 160 are turned on, and the switch 150 is turned off, so that the capacitor 170 and the capacitor 180 charge and the capacitor 190 discharges) and an amplification phase (in which the switch 130, the switch 140, and the switch 160 are turned off, and the switch 150 is turned on, so that the capacitor 170 and the capacitor 180 discharge and the capacitor 190 charges). In the amplification phase, the charge-steering amplifier 100 amplifies the differential input signal Vi (which is inputted from the node N1 and the node N2) and generates an output signal Vo (which is outputted from the node N3 and the node N4). The operational details of the charge-steering amplifier 100 are known to people having ordinary skill in the art and thus omitted for brevity.

However, the charge-steering amplifier 100 not only has low energy efficiency (because only one output signal Vo can be generated for one complete charge and discharge cycle of the capacitor 170 and the capacitor 180) but also has poor gain (because it amplifies the differential input signal Vi only once before generating the output signal Vo, making it difficult to distinguish the voltage of the node N3 from the voltage of the node N4). Therefore, an amplifier circuit is required to address at least one of the issues.

SUMMARY OF THE INVENTION

In view of the issues of the prior art, an object of the present invention is to provide an amplifier circuit, so as to make an improvement to the prior art.

According to one aspect of the present invention, an amplifier circuit is provided. The amplifier circuit that has a first output terminal and a second output terminal includes a first charge-steering amplifier, a second charge-steering amplifier, a first switch, and a second switch. The first charge-steering amplifier includes a first input terminal, a second input terminal, a first capacitor, and a second capacitor and is configured to amplify a first input signal during a first operation period. The second charge-steering amplifier includes a third input terminal, a fourth input terminal, the first capacitor, and the second capacitor and is configured to amplify a second input signal during a second operation period. The first switch is coupled between the first output terminal and a first target voltage or a second target voltage. The second switch is coupled between the second output terminal and the first target voltage or the second target voltage. The first capacitor is coupled between the first output terminal and a reference voltage. The second capacitor is coupled between the second output terminal and the reference voltage. The first capacitor and the second capacitor charge during the first operation period and discharge during the second operation period.

According to another aspect of the present invention, a charge-steering amplifier circuit is provided. The charge-steering amplifier circuit that has a first input terminal, a second input terminal, a third input terminal, a fourth input terminal, a first output terminal, and a second output terminal and includes a first transistor, a second transistor, a third transistor, a fourth transistor, a first capacitor, a second capacitor, a third capacitor, a fourth capacitor, a first switch, a second switch, a third switch, a fourth switch, a fifth switch, and a sixth switch. The first transistor has a first terminal, a second terminal, and a first control terminal, the first control terminal being electrically connected to the first input terminal, and the second terminal being electrically connected to the first output terminal. The second transistor has a third terminal, a fourth terminal, and a second control terminal, the second control terminal being electrically connected to the second input terminal, the fourth terminal being electrically connected to the second output terminal, and the third terminal being electrically connected to the first terminal. The third transistor has a fifth terminal, a sixth terminal, and a third control terminal, the third control terminal being electrically connected to the third input terminal, and the sixth terminal being electrically connected to the first output terminal. The fourth transistor has a seventh terminal, an eighth terminal, and a fourth control terminal, the fourth control terminal being electrically connected to the fourth input terminal, the eighth terminal being electrically connected to the second output terminal, and the seventh terminal being electrically connected to the fifth terminal. The first capacitor is coupled between the first terminal and a reference voltage. The second capacitor is coupled between the fifth terminal and the reference voltage. The third capacitor is coupled between the first output terminal and the reference voltage. The fourth capacitor is coupled between the second output terminal and the reference voltage. The first switch is coupled between the first capacitor and the first terminal. The second switch is coupled to the first capacitor which discharges when the second switch is turned on. The third switch is coupled between the second capacitor and the fifth terminal. The fourth switch is coupled to the second capacitor which charges when the fourth switch is turned on. The fifth switch is configured to couple the first output terminal to a first target voltage or a second target voltage. The sixth switch is configured to couple the second output terminal to the first target voltage or the second target voltage.

In comparison with the conventional technology, the amplifier circuit of the present invention has a greater gain or is more energy efficient.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes amplifier circuits. On account of that some or all elements of the amplifier circuits could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 1:
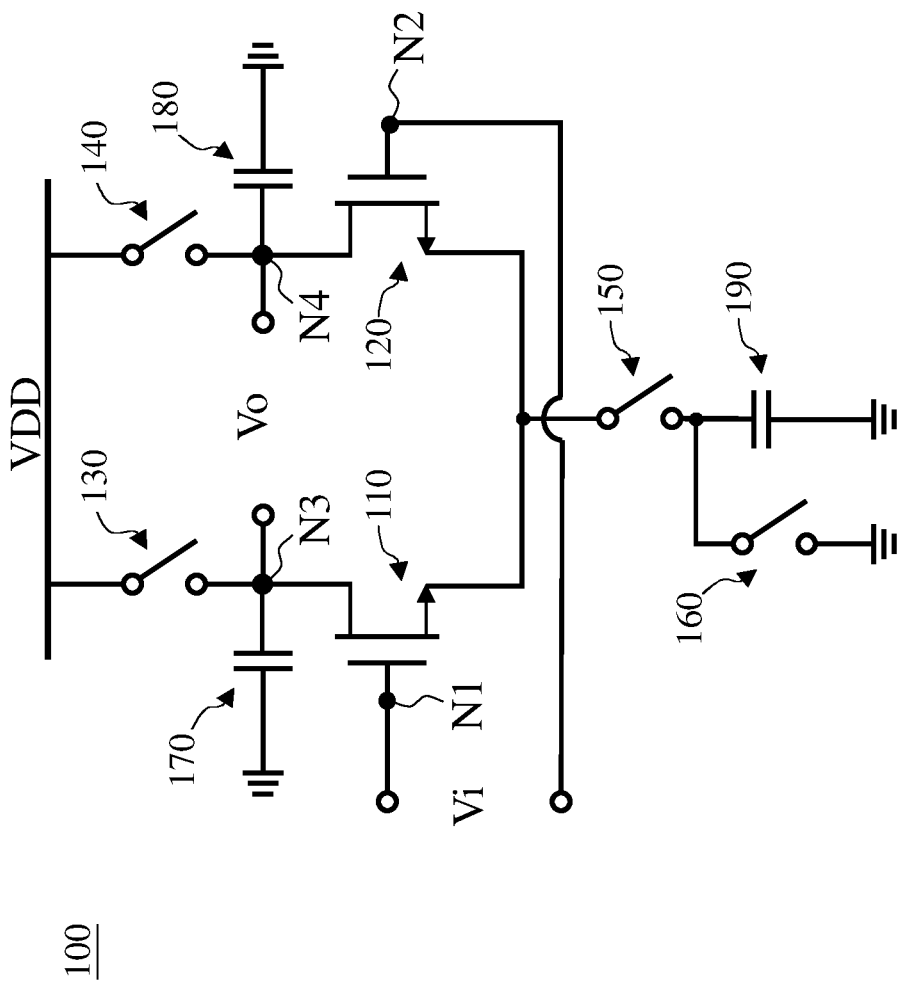
FIG. 1 illustrates a circuit diagram of a conventional charge-steering amplifier.
Figure 2:
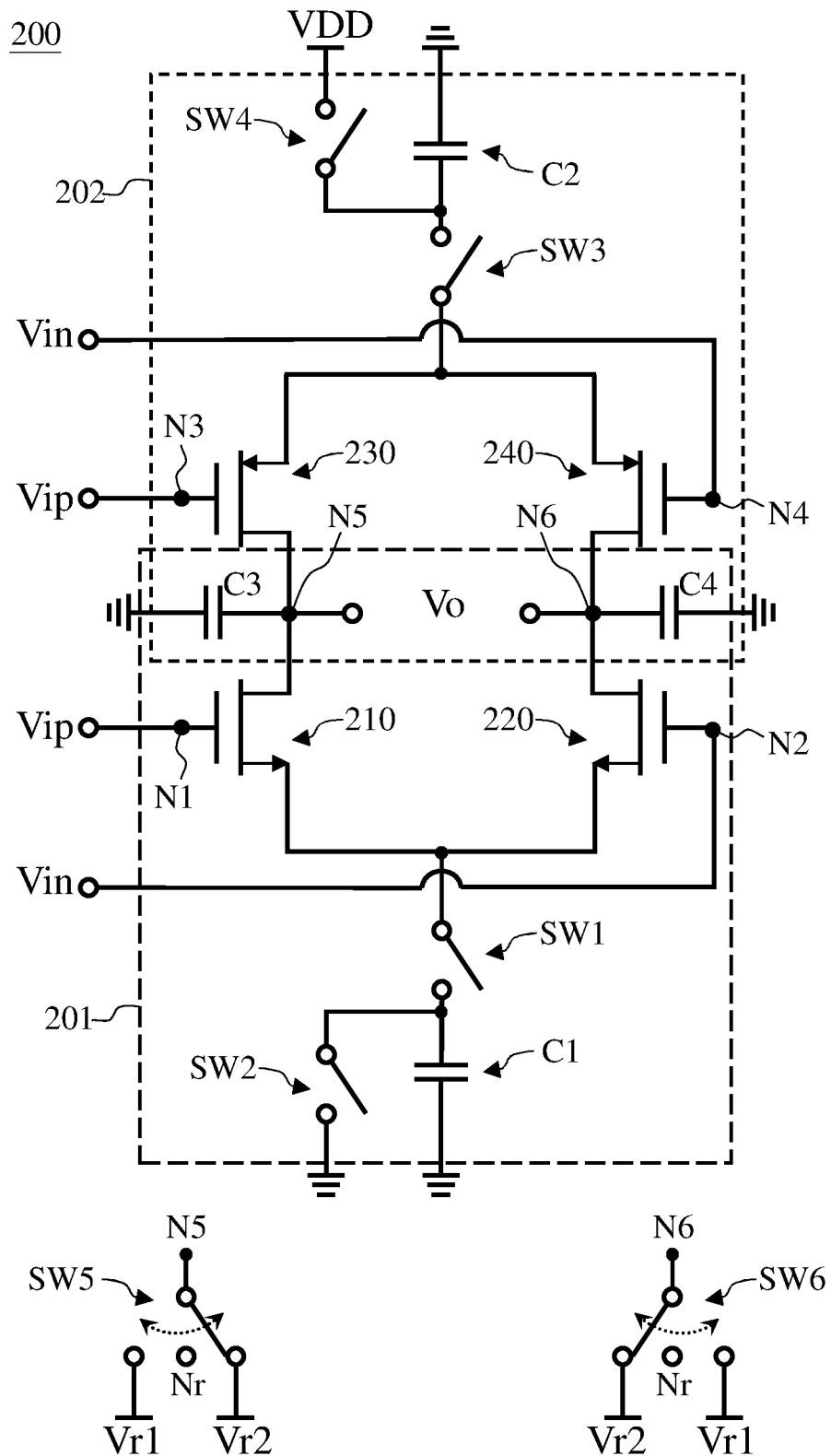
FIG. 2 illustrates a circuit diagram of an amplifier circuit according to an embodiment of the present invention.

FIG. 2 is a circuit diagram of an amplifier circuit according to an embodiment of the present invention. The charge-steering amplifier circuit 200 (or simply referred to as the amplifier circuit 200) includes a charge-steering amplifier 201 and a charge-steering amplifier 202. The charge-steering amplifier 201 receives the differential input signal Vi (including the signal Vip and the signal Vin) at the input terminal (i.e., node N1) and the input terminal (i.e., node N2), and outputs the output signal Vo at the output terminal (i.e., node N5) and the output terminal (i.e., node N6). The charge-steering amplifier 202 receives the differential input signal Vi (including the signal Vip and the signal Vin) at the input terminal (i.e., node N3) and the input terminal (i.e., node N4), and outputs the output signal Vo at the output terminal (i.e., node N5) and the output terminal (i.e., node N6).

The charge-steering amplifier 201 includes a transistor 210 (e.g., an N-channel Metal-Oxide-Semiconductor Field-Effect Transistor (NMOS transistor for short)), a transistor 220 (e.g., an NMOS transistor), a switch SW1, a switch SW2, a capacitor C1, a capacitor C3, and a capacitor C4. The first terminal (e.g., the drain) of the transistor 210 is coupled or electrically connected to the node N5; the second terminal (e.g., the source) of the transistor 210 is coupled or electrically connected to the switch SW1; the control terminal (e.g., the gate) of the transistor 210 is coupled or electrically connected to the node N1. The first terminal (e.g., the drain) of the transistor 220 is coupled or electrically connected to the node N6; the second terminal (e.g., the source) of the transistor 220 is coupled or electrically connected to the switch SW1 and the second terminal of the transistor 210; the control terminal (e.g., the gate) of the transistor 220 is coupled or electrically connected to the node N2. The switch SW1 is coupled between the capacitor C1 and the second terminal of the transistor 210, and the switch SW1 is also coupled between the capacitor C1 and the second terminal of the transistor 220. The first end of the capacitor C1 is coupled or electrically connected to the switch SW1, and the second end of the capacitor C1 is coupled or electrically connected to the first reference voltage (e.g., ground). One end of the switch SW2 is coupled or electrically connected to the first end of the capacitor C1, and the other end of the switch SW2 is coupled or electrically connected to the first reference voltage. The capacitor C3 is coupled or electrically connected between the node N5 and the first reference voltage. The capacitor C4 is coupled or electrically connected between the node N6 and the first reference voltage.

The charge-steering amplifier 202 includes a transistor 230 (e.g., a P-channel Metal-Oxide-Semiconductor Field-Effect Transistor (PMOS transistor for short)), a transistor 240 (e.g., a PMOS transistor), a switch SW3, a switch SW4, a capacitor C2, the capacitor C3, and the capacitor C4 (the capacitor C3 and the capacitor C4 being shared with the charge-steering amplifier 201). The first terminal (e.g., the drain) of the transistor 230 is coupled or electrically connected to the node N5; the second terminal (e.g., the source) of the transistor 230 is coupled or electrically connected to the switch SW3; the control terminal (e.g., the gate) of the transistor 230 is coupled or electrically connected to the node N3. The first terminal (e.g., the drain) of the transistor 240 is coupled or electrically connected to the node N6; the second terminal (e.g., the source) of the transistor 240 is coupled or electrically connected to the switch SW3 and the second terminal of the transistor 230; the control terminal (e.g., the gate) of the transistor 240 is coupled or electrically connected to the node N4. The switch SW3 is coupled between the capacitor C2 and the second terminal of the transistor 230, and the switch SW3 is also coupled between the capacitor C2 and the second terminal of the transistor 240. The first end of the capacitor C2 is coupled or electrically connected to the switch SW3, and the second end of the capacitor C2 is coupled or electrically connected to the first reference voltage. One end of the switch SW4 is coupled or electrically connected to the first end of the capacitor C2, and the other end of the switch SW4 is coupled or electrically connected to a second reference voltage (e.g., the power supply voltage VDD). The second reference voltage is greater than the first reference voltage.

The amplifier circuit 200 further includes a switch SW5 and a switch SW6. The switch SW5 and the switch SW6 may be turned on (i.e., switched to the first target voltage Vr1 or the second target voltage Vr2) or turned off (i.e., switched to the neutral position Nr). When the switch SW5 and the switch SW6 are turned on, the switch SW5 and the switch SW6 couple or electrically connect the node N5 and the node N6 to the first target voltage Vr1 or the second target voltage Vr2, respectively.

In some embodiments, the first target voltage Vr1 is equal to the second reference voltage (e.g., the power supply voltage VDD) or a half of the second reference voltage (e.g., a half of the power supply voltage VDD), and the second target voltage Vr2 is equal to the first reference voltage (e.g., ground) or a half of the second reference voltage (e.g., a half of the power supply voltage VDD). In other words, when the node N5 and the node N6 are coupled or electrically connected to the first target voltage Vr1, the voltage across the capacitor C3 and the voltage across the capacitor C4 are substantially the second reference voltage or a half of the second reference voltage; when the node N5 and the node N6 are coupled or electrically connected to the second target voltage Vr2, the voltage across the capacitor C3 and the voltage across the capacitor C4 are substantially zero or a half of the second reference voltage.

In some embodiments, the switch SW1, the switch SW2, the switch SW3, the switch SW4, the switch SW5, and the switch SW6 may be embodied by transistors.

Figure 3:
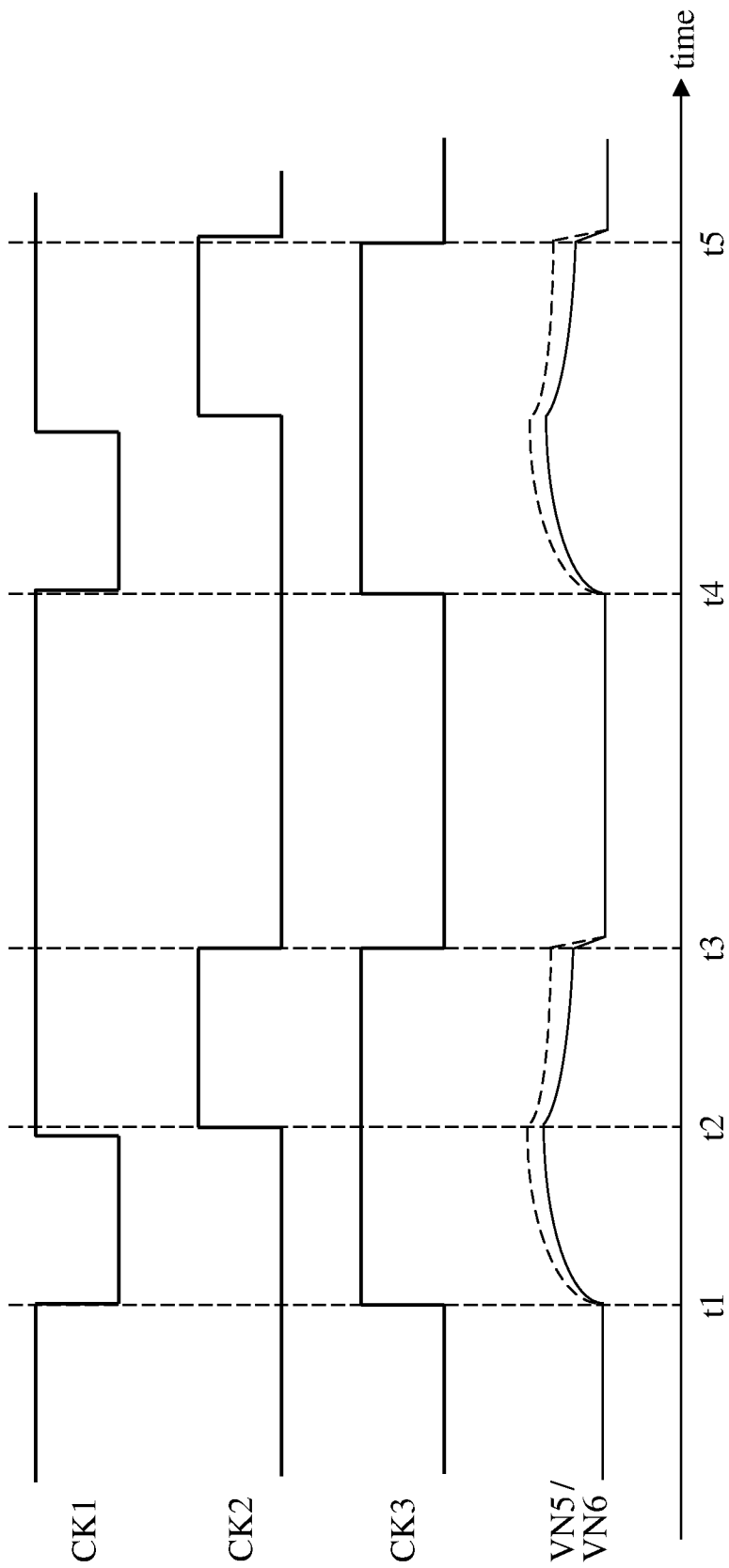
FIG. 3 illustrates a timing diagram of the amplifier circuit according to an example operation of the present invention.

FIG. 3 is a timing diagram of the amplifier circuit according to an example operation of the present invention. Reference is made to FIGS. 2 and 3 at the same time. In the following discussion, the switch SW3 is switched (i.e., turned on or off) according to the clock CK1: the switch SW3 is turned off when the clock CK1 is at the first level (e.g., a high level) and turned on when the clock CK1 is at the second level (which is different from the first level, e.g., a low level). The switch SW1 is switched according to the clock CK2: the switch SW1 is turned on when the clock CK2 is at the first level and turned off when the clock CK2 is at the second level. The voltage VN5 represents the voltage of the node N5, and the voltage VN6 represents the voltage of the node N6.

When the clock CK3 is at the first level (e.g., between the time point t1 and the time point t3), the amplifier circuit 200 operates in the amplification phase; when the clock CK3 is at the second level (e.g., between the time point t3 and the time point t4), the amplifier circuit 200 operates in the reset phase.

In the embodiment of FIG. 3, when the switch SW5 and the switch SW6 are turned on, the node N5 and the node N6 are coupled or electrically connected to the second target voltage Vr2, and the switch SW2, the switch SW4, the switch SW5 and the switch SW6 are switched according to the clock CK3: the switch SW2, the switch SW4, the switch SW5, and the switch SW6 are turned off when the clock CK3 is at the first level and turned on when the clock CK3 is at the second level.

As shown in FIG. 3, a transition of the clock CK3 from the second level to the first level (which is indicative of the end of the reset phase and the start of the amplification phase) occurs at the time point t1, at which the voltage VN5 and the voltage VN6 are the second target voltage Vr2. A transition of the clock CK2 from the second level to the first level occurs at the time point t2. The amplification phase includes a first operation period (corresponding to the clock CK1 being at the second level) and a second operation period (corresponding to the clock CK1 being at the first level). The first operation period is substantially equal to or slightly shorter than the time period between the time point t1 and the time point t2; in other words, the time point at which the clock CK1 transitions from the first level to the second level may be substantially equal to or slightly later than the time point t1, and the time point at which the clock CK1 transitions from the second level to the first level may be substantially equal to or slightly earlier than the time point t2. The second operation period is substantially equal to or slightly shorter than the time period between the time point t2 and the time point t3; in other words, the time point at which the clock CK2 transitions from the second level to the first level is substantially equal to the time point t2, and the time point at which the clock CK2 transitions from the first level to the second level may be substantially equal to or slightly later than the time point t3. A transition of the clock CK3 from the first level to the second level (which is indicative of the end of the amplification phase and the start of the reset phase) occurs at the time point t3.

Please refer to FIG. 2 and FIG. 3 at the same time. During the first operation period, in which the switch SW3 is turned on and the switch SW1 is turned off, the transistors 230 and 240 are active and the transistors 210 and 220 are inactive, causing the capacitors C3 and C4 to charge. The transistors 230 and 240 amplify the differential input signal Vi during the first operation period; as a result, the difference between the voltage VN5 (e.g., the dashed line) and the voltage VN6 (e.g., the solid line) gradually increases. During the second operation period, in which the switch SW1 is turned on and the switch SW3 is turned off, the transistors 210 and 220 are active and the transistors 230 and 240 are inactive, causing the capacitors C3 and C4 to discharge. During the second operation period, the transistor 210 and the transistor 220 continue the amplification of the differential input signal Vi (which is the same as the differential input signal Vi in the first operation period) from the state of the voltage VN5 and the voltage VN6 at the time point t2, making the difference between voltage VN5 and voltage VN6 become even greater. In other words, the difference between the voltage VN5 and the voltage VN6 at the time point t3 is greater than the difference between the voltage VN5 and the voltage VN6 at the time point t2. It can be observed that the second amplification renders greater difference between the voltage VN5 and the voltage VN6, which is good for the operation of the circuit that follows (e.g., a comparator). By contrast, because the conventional charge-steering amplifier 100 amplifies the differential input signal only once, the generation of the output signal Vo by the charge-steering amplifier 100 for the same differential input signal Vi corresponds at most to the output signal Vo at the time point t2. That is to say, the gain of the amplifier circuit 200 of this disclosure is greater than that of the charge-steering amplifier 100.

Note that since the differential input signal Vi remains unchanged between the time point t1 and the time point t3 (which means that the sampling result generated by the sample-and-hold circuit (not shown) in the previous reset phase is maintained), the transistor 210, the transistor 220, the transistor 230, and the transistor 240 perform amplification operations based on the same differential input signal Vi in the same amplification phase (e.g., between the time point t1 and the time point t3). The differential input signal Vi between the time point t4 and the time point t5 is the result of the sampling operation between the time point t3 and the time point t4.

Figure 4:
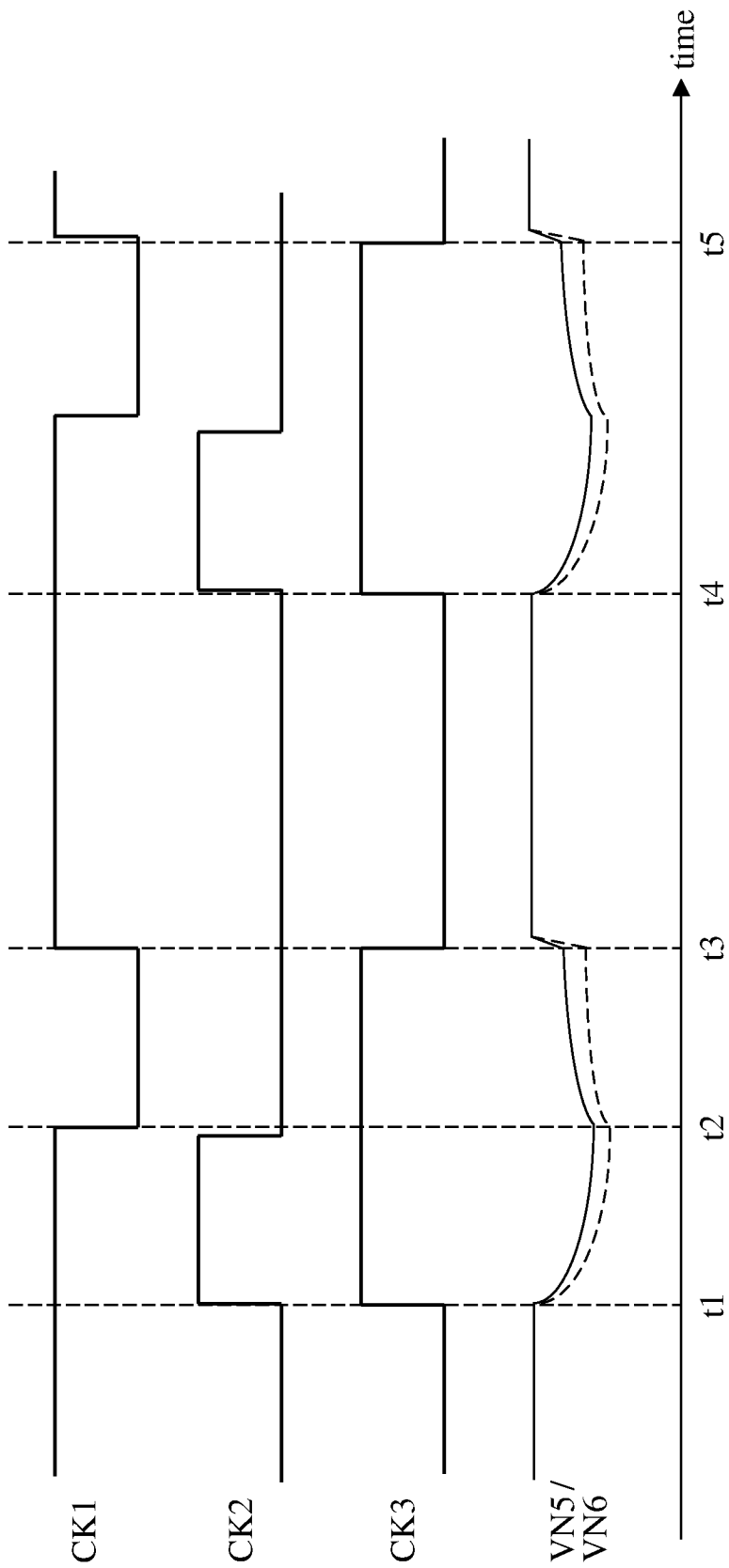
FIG. 4 illustrates a timing diagram of the amplifier circuit according to another example operation of the present invention.

FIG. 4 is a timing diagram of the amplifier circuit according to another example operation of the present invention. FIG. 4 is similar to FIG. 3, except that in each amplification phase, the second operation period is prior to the first operation period, and in each reset phase, the switch SW5 and the switch SW6 couple or electrically connect the node N5 and the node N6 to the first target voltage Vr1 rather than the second target voltage Vr2. Therefore, in the amplification phase the voltage VN5 and the voltage VN6 first decrease (i.e., the capacitor C3 and the capacitor C4 discharge, for example, between the time point t1 and the time point t2) and then increase (i.e., the capacitor C3 and the capacitor C4 charge, for example, between the time point t2 and the time point t3). Similar to the embodiment of FIG. 3, the differential input signal Vi is amplified twice in each amplification phase, rendering greater difference between the voltage VN5 and the voltage VN6, which is advantageous for the operation of the circuit that follows (e.g., a comparator).

Figure 5:
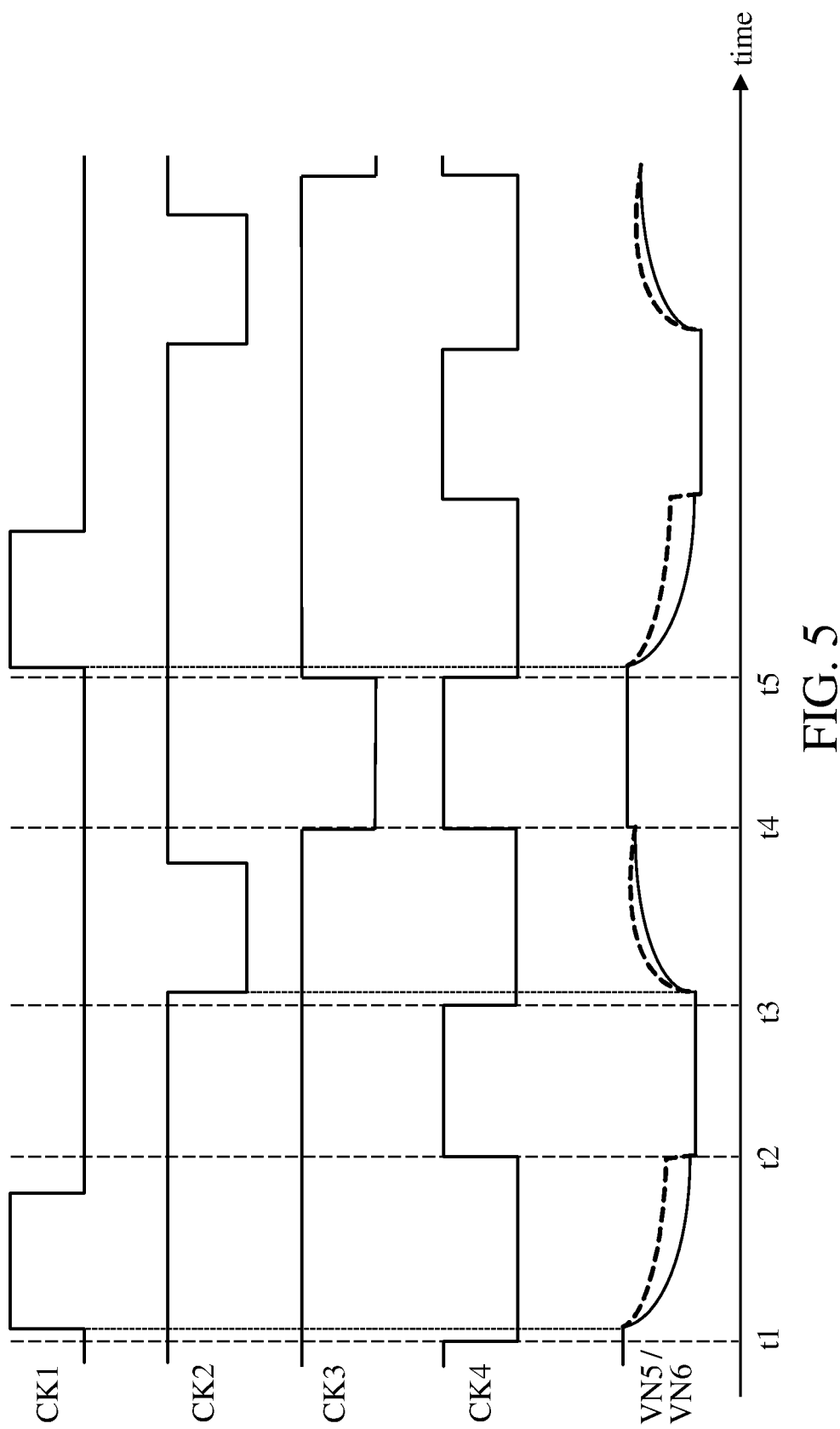
FIG. 5 illustrates a timing diagram of the amplifier circuit according to another example operation of the present invention.

FIG. 5 is a timing diagram of the amplifier circuit according to another example operation of the present invention. In the embodiment of FIG. 5, the switch SW2 and the switch SW4 are switched according to the clock CK3: the switch SW2 and the switch SW4 are turned off when the clock CK3 is at the first level and turned on when the clock CK3 is at the second level. The switch SW5 and the switch SW6 are switched according to the clock CK4. When the clock CK4 is at the second level (e.g., between the time point t1 and the time point t2 or between the time point t3 and the time point t4), the amplifier circuit 200 operates in the amplification phase; when the clock CK4 is at the first level (e.g., between the time point t2 and the time point t3 or between the time point t4 and the time point t5), the amplifier circuit 200 operates in the reset phase. Similarly, the embodiment of FIG. 5 also includes a first operation period (corresponding to the clock CK1 being at the first level) and a second operation period (corresponding to the clock CK2 being at the second level). As shown in FIG. 5, in this embodiment, a reset phase is arranged between the first operation period (corresponding to the first amplification operation) and the second operation period (corresponding to the second amplification operation); in other words, before the start of the first operation period and the start of the second operation period, the voltages (i.e., the voltage VN5 and the voltage VN6) at the output terminals (i.e., the node N5 and the node N6) of the amplifier circuit 200 are reset, that is, the voltages at the ends of the capacitor C3 and the capacitor C4 are reset.

As shown in FIG. 5, the transitions of the clock CK4 from the first level to the second level occur at the time point t1 and the time point t3, and the transitions of the clock CK4 from the second level to the first level occur at the time point t2 and the time point t4.

The first operation period is substantially equal to or slightly shorter than the time period between the time point t1 and the time point t2; in other words, the time point at which the clock CK1 transitions from the second level to the first level may be substantially equal to or slightly later than the time point t1, and the time point at which the clock CK1 transitions from the first level to the second level may be substantially equal to or slightly earlier than the time point t2. The second operation period is substantially equal to or slightly shorter than the time period between the time point t3 and the time point t4; in other words, the time point at which the clock CK2 transitions from the first level to the second level is substantially equal to or slightly later than the time point t3, and the time point at which the clock CK2 transitions from the second level to the first level may be substantially equal to or slightly earlier than the time point t4.

Please refer to FIGS. 2 and 5. During the first operation period (e.g., the first operation period between the time point t1 and the time point t2), the switch SW1 is turned on and the switch SW3 is turned off (i.e., the transistor 210 and the transistor 220 become active and the transistor 230 and the transistor 240 become inactive, causing the capacitor C3 and the capacitor C4 to discharge), the transistor 210 and the transistor 220 amplify the differential input signal Vi, leading to an increase of the difference between the voltage VN5 and the voltage VN6. During the reset phase that follows the first operation period (e.g., between the time point t2 and the time point t3), the switch SW5 and the switch SW6 couple or electrically connect the node N5 and the node N6 to the second target voltage Vr2. During the immediate second operation period that follows (e.g., the second operation period between the time point t3 and the time point t4), the switch SW1 is turned off and the switch SW3 is turned on (i.e., the transistor 210 and the transistor 220 become inactive and the transistor 230 and the transistor 240 become active, causing the capacitor C3 and the capacitor C4 to charge), the transistor 230 and the transistor 240 amplify the differential input signal Vi, leading to an increase of the difference between the voltage VN5 and the voltage VN6. During the reset phase that follows the second operation period (e.g., between the time point t4 and the time point t5), the switch SW5 and the switch SW6 couple or electrically connect the node N5 and the node N6 to the first target voltage Vr1.

Note that because the sample-and-hold circuit samples in the reset phases, the amplifier circuit 200 amplifies different differential input signals Vi in the first operation period and the second operation period in the embodiment of FIG. 5. In other words, the amplifier circuit 200 amplifies the sampling results from two different sampling operations, rather than amplifying the sampling result from the same sampling operation.

As shown in FIG. 5, in the time period between the time point t1 and the time point t5, although the capacitor C3 and the capacitor C4 charge only once (approximately between the time point t3 and the time point t5), the amplifier circuit 200 produces two amplification results, meaning that in the long run, the amplifier circuit 200 generates the odd-numbered amplification results in the first operation periods and the even-numbered amplification results in the second operation periods. Therefore, the amplifier circuit 200 is more energy efficient than the conventional charge-steering amplifier 100.

The transistors discussed above can also be embodied by the bipolar junction transistors (BJTs). The emitter, collector, and base of a BJT may correspond to the source, drain, and gate of a MOSFET, respectively. The details are known to people having ordinary skill in the art and thus omitted for brevity.

Please note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An amplifier circuit having a first output terminal and a second output terminal, comprising:
    a first charge-steering amplifier comprising a first input terminal, a second input terminal, a first capacitor, and a second capacitor and configured to amplify a first input signal during a first operation period;
    a second charge-steering amplifier comprising a third input terminal, a fourth input terminal, the first capacitor, and the second capacitor and configured to amplify a second input signal during a second operation period;
    a first switch coupled between the first output terminal and a first target voltage or a second target voltage; and
    a second switch coupled between the second output terminal and the first target voltage or the second target voltage;
    wherein the first capacitor is coupled between the first output terminal and a reference voltage, the second capacitor is coupled between the second output terminal and the reference voltage, the first capacitor and the second capacitor charge during the first operation period, and the first capacitor and the second capacitor discharge during the second operation period.

2. The amplifier circuit of claim 1, wherein the first charge-steering amplifier comprises a first P-channel MOSFET and a second P-channel MOSFET, the second charge-steering amplifier comprises a first N-channel MOSFET and a second N-channel MOSFET, a first gate of the first P-channel MOSFET is the first input terminal, a second gate of the second P-channel MOSFET is the second input terminal, a third gate of the first N-channel MOSFET is the third input terminal, and a fourth gate of the second N-channel MOSFET is the fourth input terminal.

3. The amplifier circuit of claim 2, wherein the first input signal is identical to the second input signal, and the first operation period is prior to the second operation period.

4. The amplifier circuit of claim 3, wherein before the first operation period starts, a first voltage across the first capacitor and a second voltage across the second capacitor are substantially zero.

5. The amplifier circuit of claim 3, wherein before the first operation period starts, a first voltage across the first capacitor and a second voltage across the second capacitor are substantially a half of a power supply voltage of the amplifier circuit.

6. The amplifier circuit of claim 2, wherein the first input signal is identical to the second input signal, and the second operation period is prior to the first operation period.

7. The amplifier circuit of claim 6, wherein before the second operation period starts, a first voltage across the first capacitor and a second voltage across the second capacitor are substantially a power supply voltage of the amplifier circuit.

8. The amplifier circuit of claim 6, wherein before the second operation period starts, a first voltage across the first capacitor and a second voltage across the second capacitor are substantially a half of a power supply voltage of the amplifier circuit.

9. The amplifier circuit of claim 2, wherein the first input signal is different from the second input signal, and the first capacitor and the second capacitor are reset between the first operation period and the second operation period.

10. The amplifier circuit of claim 9, wherein the first capacitor and the second capacitor are reset to the first target voltage when the first operation period ends; the first capacitor and the second capacitor are reset to the second target voltage when the second operation period ends; and the first target voltage is greater than or equal to the second target voltage.

11. A charge-steering amplifier circuit having a first input terminal, a second input terminal, a third input terminal, a fourth input terminal, a first output terminal, and a second output terminal, comprising:
a first transistor having a first terminal, a second terminal, and a first control terminal, wherein the first control terminal is electrically connected to the first input terminal, and the second terminal is electrically connected to the first output terminal;
a second transistor having a third terminal, a fourth terminal, and a second control terminal, wherein the second control terminal is electrically connected to the second input terminal, the fourth terminal is electrically connected to the second output terminal, and the third terminal is electrically connected to the first terminal;
a third transistor having a fifth terminal, a sixth terminal, and a third control terminal, wherein the third control terminal is electrically connected to the third input terminal, and the sixth terminal is electrically connected to the first output terminal;
a fourth transistor having a seventh terminal, an eighth terminal, and a fourth control terminal, wherein the fourth control terminal is electrically connected to the fourth input terminal, the eighth terminal is electrically connected to the second output terminal, and the seventh terminal is electrically connected to the fifth terminal;
a first capacitor coupled between the first terminal and a reference voltage;
a second capacitor coupled between the fifth terminal and the reference voltage;
a third capacitor coupled between the first output terminal and the reference voltage;
a fourth capacitor coupled between the second output terminal and the reference voltage;
a first switch coupled between the first capacitor and the first terminal;
a second switch coupled to the first capacitor, wherein the first capacitor discharges when the second switch is turned on;
a third switch coupled between the second capacitor and the fifth terminal;
a fourth switch coupled to the second capacitor, wherein the second capacitor charges when the fourth switch is turned on;
a fifth switch configured to couple the first output terminal to a first target voltage or a second target voltage; and
a sixth switch configured to couple the second output terminal to the first target voltage or the second target voltage.

12. The charge-steering amplifier circuit of claim 11, wherein the first transistor and the second transistor are N-channel MOSFETs, the third transistor and the fourth transistor are P-channel MOSFETs, the first terminal, the third terminal, the fifth terminal, and the seventh terminal are sources, the second terminal, the fourth terminal, the sixth terminal, and the eighth terminal are drains, and the first control terminal, the second control terminal, the third control terminal, and the fourth control terminal are gates.

13. The charge-steering amplifier circuit of claim 12, wherein the charge-steering amplifier circuit performs an amplification operation; during the amplification operation, the third switch is turned on before the first switch is turned on; and the first switch and the third switch are not turned on at the same time.

14. The charge-steering amplifier circuit of claim 13, wherein the fifth switch and the sixth switch couple the first output terminal and the second output terminal to the first target voltage before the amplification operation, and the first target voltage is ground.

15. The charge-steering amplifier circuit of claim 13, wherein the fifth switch and the sixth switch couple the first output terminal and the second output terminal to the first target voltage before the amplification operation, and the first target voltage is substantially a half of a power supply voltage of the charge-steering amplifier circuit.

16. The charge-steering amplifier circuit of claim 12, wherein the charge-steering amplifier circuit performs an amplification operation; during the amplification operation, the first switch is turned on before the third switch is turned on; and the first switch and the third switch are not turned on at the same time.

17. The charge-steering amplifier circuit of claim 16, wherein the fifth switch and the sixth switch couple the first output terminal and the second output terminal to the second target voltage before the amplification operation, and the second target voltage is a power supply voltage of the charge-steering amplifier circuit.

18. The charge-steering amplifier circuit of claim 16, wherein the fifth switch and the sixth switch couple the first output terminal and the second output terminal to the second target voltage before the amplification operation, and the second target voltage is substantially a half of a power supply voltage of the charge-steering amplifier circuit.

19. The charge-steering amplifier circuit of claim 12, wherein the first target voltage is different from the second target voltage; the charge-steering amplifier circuit performs a first amplification operation and a second amplification operation; the fifth switch and the sixth switch couple the first output terminal and the second output terminal to the first target voltage before the first amplification operation; and the fifth switch and the sixth switch couple the first output terminal and the second output terminal to the second target voltage between the first amplification operation and the second amplification operation.

20. The charge-steering amplifier circuit of claim 19, wherein during the first amplification operation, the first switch is turned off and the third switch is turned on; during the second amplification operation, the first switch is turned on and the third switch is turned off; and the first target voltage is smaller than the second target voltage.

\* \* \* \* \*